United States Patent [19]

Yamada et al.

[11] Patent Number: 4,816,962

[45] Date of Patent: Mar. 28, 1989

[54] UNIFORM MAGNETIC FIELD COIL

[75] Inventors: Tadatoshi Yamada; Masao Morita; Shunji Yamamoto; Tetsuya Matsuda; Masatami Iwamoto, all of Amagasaki, Japan

[73] Assignee: Mitsubishi Denki Kabushiki Kaisha, Japan

[21] Appl. No.: 124,369

[22] Filed: Nov. 20, 1987

Related U.S. Application Data

[63] Continuation of Ser. No. 921,241, Oct. 21, 1986, abandoned.

[30] Foreign Application Priority Data

Oct. 24, 1985 [JP] Japan ................ 60-236424

[51] Int. Cl.⁴ .............. G01R 33/20; H01H 47/00
[52] U.S. Cl. .................... 361/141; 361/146; 335/216
[58] Field of Search ............ 361/19, 141, 146; 335/216; 324/320

[56] References Cited

U.S. PATENT DOCUMENTS

| | | | |
|---|---|---|---|
| 3,406,333 | 10/1968 | Nelson | 361/141 |
| 3,419,904 | 12/1968 | Weaver et al. | 361/141 |
| 3,474,294 | 10/1969 | Weaver, Jr. et al. | 361/19 |
| 3,510,832 | 5/1970 | Golay | 361/146 |
| 3,568,002 | 3/1971 | Robins et al. | 361/141 |
| 3,711,744 | 1/1973 | Luton, Jr. | 361/19 |
| 4,467,384 | 8/1984 | Yuasa | 361/19 |
| 4,535,291 | 8/1985 | Lee et al. | 335/216 |
| 4,683,434 | 7/1987 | Tschopp | 304/32 |

FOREIGN PATENT DOCUMENTS 2301152 7/1973 Fed. Rep. of Germany ........ 361/19

OTHER PUBLICATIONS

"NMR Medical Science", NMR Medical Science Study Association, Jan. 20, 1984, Maruzen K. K.
"High Homogenious Field Superconducting Magnet", Teruo Noguchi, Low Temperature Engineering, vol. 11, No. 6, 1976, pp. 241–251.

Primary Examiner—L. T. Hix
Assistant Examiner—David Porterfield
Attorney, Agent, or Firm—Leydig, Voit & Mayer

[57] ABSTRACT

A uniform magnetic field coil assembly having a plurality of pairs of coil elements each included in circuit comprising the parallel connection of a permanent current switch and its protecting means and an individual exciting power source, wherein the plurality of pairs of coil elements are symmetrically disposed against a plane perpendicular to the central axis of the uniform magnetic field coil assembly in the longitudinal direction and the plurality of pairs of coil elements are connected in series, thereby regulating the current flowing to each of the plurality of pairs of coil assembly elements for forming the uniform magnetic field coil as predetermined.

7 Claims, 5 Drawing Sheets

UNIFORM MAGNETIC FIELD COIL

This application is a continuation of application Ser. No. 921,241, filed Oct. 21, 1986, now abandoned.

BACKGROUND OF THE INVENTION

This invention relates to a uniform magnetic field coil and, more particularly, to a uniform magnetic field coil, for example, for magnetic resonance imaging, capable of increasing the tolerable error of dimensions in its fabrication condition and of readily compensating irregular magnetic field components based on the error in dimensions.

FIG. 1 shows a prior-art uniform magnetic field coil with a notch, which is disclosed, for example in the thesis entitled "High Homogenious Field Superconducting Magnet" written by Teruo Noguchi on pages 241-251 of Japanese Magazine "Low Temperature Engineering", vol. 11, No. 6 (1976). FIG. 1 is a sectional view in the longitudinal direction of a cylindrical coil 1 with a notch. By utilizing a notched construction, the spacial distribution of the magnetic field near a coordinate origin O becomes uniform. The coil 1 is symmetrical with respect to a plane passing through the coordinate origin O perpendicular to the Z-axis and denoted by the symbol R as shown in FIG. 1. The magnetic filed Hz produced at a point Q is given by the following equation (1):

$$Hz = ja_1\{F + FE_2(\rho/a_1)^2 P_2(u) + FE_4(\rho/a_1)^4 P_4(u) + FE_6(\rho/a_1)^6 P_6(u) + FE_8(\rho/a_1)^8 P_8(u) + \ldots\} \quad (1)$$

where j=current density in the coil,
$a_1$=inner diameter of the coil,
$\rho$=distance between the origin and the point Q,
$u = \cos\theta$,
$\theta$=angle formed between the line segment OQ and the z-axis
F, $FE_n$=function of the sectional shape of the coil,
P(u)=Legendre function.

The first term of the right-hand side of equation (1) is a spatially uniform component independent of position ($\rho$, $\theta$), but all the terms other than the first term are dependent upon position, i.e., the irregular magnetic field components in space. In the uniform magnetic field coil, the spacial distribution of the magnetic field is uniform in the range where $(\rho/a_1) < 1$. As described above, since $(\rho/a_1) < 1$, if terms are sequentially set to zero starting with the terms of lower degree of $(\rho/a_1)$, then higher uniformity of the magnetic field can be attained. In the prior-art coil shown in FIG. 1, the first term of the right-hand side of the equation (1) is set to a predetermined value, and the second and third terms are set to 0 by controlling the sectional shape of the coil.

$$ja_1 F = H_0 \quad (2)$$

$$FE_2 = 0 \quad (3)$$

$$FE_4 = 0 \quad (4)$$

where $H_0$ denotes the magnetic field which is necessary for the magnetic resonance imaging. Since the coil inner diameter $a_1$, the coil length $2b$ and the current density j are ordinarily given coil design conditions, the parameters taken as design parameters are the two types of coil outer diameters $a_2$, $a_N$ and the notch length $2b_N$, each parameter denoting its corresponding dimension, as shown in FIG. 1. Since there are three equations relating to the design parameters (i.e., equations (2), (3) and (4)), these designing parameters $a_2$, $a_N$ and $2b_N$ can be individually determined.

In a coil designed in this manner, an irregular magnetic field component is introduced by the presence of terms of degree 6 or higher in the right-hand side of equation (1). Therefore, the coil obtained by the above design is called "sextic compensation coil". If the sectional shape of the coil is made more complicated to increase the number of design parameters, then the number of irregular magnetic field components which can be set to zero increases, with the result that a uniform magnetic field coil capable of compensating in a higher degree can be designed. In fact, the lower degree term of the irregular magnetic field might be generated by the influence of dimensional error present in the manufacturing process of the coil and the presence of an iron body near the coil, although a coil based on a predetermined design concept such as that outlined above, for example, is still referred to as a "sextic compensation coil". Besides, the irregular magnetic field component actually generated is ordinarily removed by installing a special correcting coil called "shim coil" (not shown) for generating only the component of the irregular magnetic field on the outer periphery of the coil 1 in FIG. 1.

Since the prior-art uniform magnetic field coil is constructed as described above, the finishing accuracy of the sectional shape of the coil must be extremely good, and therefore, the prior-art coil has the drawback that manufacturing is very difficult. Further, said coil has another drawback that some special means such as a shim coil or the like must be employed in order to remove the irregular magnetic field generated due to dimensional error in the manufacturing process.

SUMMARY OF THE INVENTION

This invention is intended to overcome the above-mentioned drawbacks, and has, for its object the provision of a uniform magnetic field coil assembly wherein the coil assembly is formed of a plurality of coil elements. Irregular magnetic field components generated by dimensional errors inherent in the manufacturing process are removed by regulating the current flowing to the respective coil elements. Thus, the tolerable dimensional error of the uniform magnetic field coil assembly is increased so as to facilitate the manufacturing thereof.

DESCRIPTION OF THE PREFERRED EMBODIMENT

The fundamental construction of a uniform magnetic field coil assembly according to this invention will be described with reference to FIGS. 2 and 3.

Figure 2:
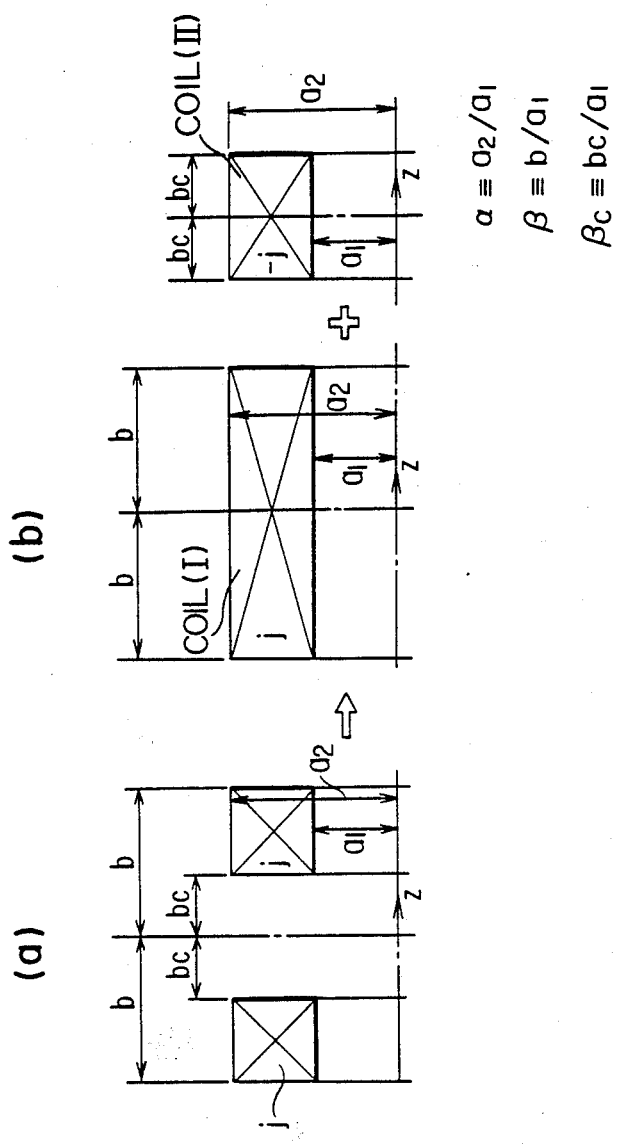
FIG. 2 is a view of the fundamental construction of a pair of coil elements used in a uniform magnetic field coil assembly according to this invention.

In FIG. 2, a pair of coil elements disposed symmetrically as shown in FIG. 2(a) is formed by the combination of two equivalent coils I and II as shown in FIG. 2(b), and the magnetic field in relation to the axis of such a pair of coils can be represented by the following equation (5):

$$Hz = Ja_1[F_o(\alpha, \beta) - F_c(\alpha, \beta_C) + \{F_oE_2(\alpha, \beta) - F_CE_2(\alpha, \beta)\}(\rho/a_1)^2 P_2(u) + \{F_oE_4(\alpha, \beta) - F_cE_4(\alpha, \beta)\}(\rho/a_1)^4 P_4(u) + \ldots] \quad (5)$$

where $F_0$, $F_0E_n$ denote the functions representing the magnetic field produced by the equivalent coil I, and $F_c$, $F_cE_n$ denote the functions representing the magnetic field produced by the equivalent coil II. The equation (5) can be rewritten as the following equation (6):

$$H_z = ja_1\{f(\alpha,\beta,\beta_c) + fE_2(\alpha,\beta,\beta_c)(\rho/a_1)^2 P_2(u) + fE_4(\alpha,\beta,\beta_c)(\rho/a_1)^4 P_4(u) + \ldots\} \quad (6)$$

Figure 3:
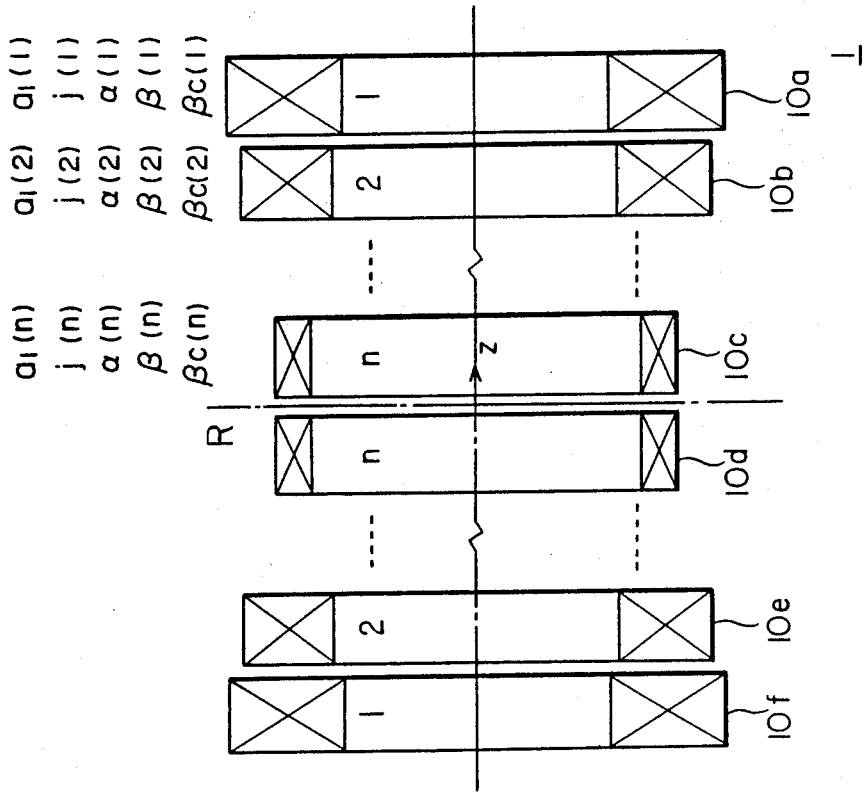
FIG. 3 is a view of the fundamental construction of a uniform magnetic field coil assembly according to this invention.
Figure 1:
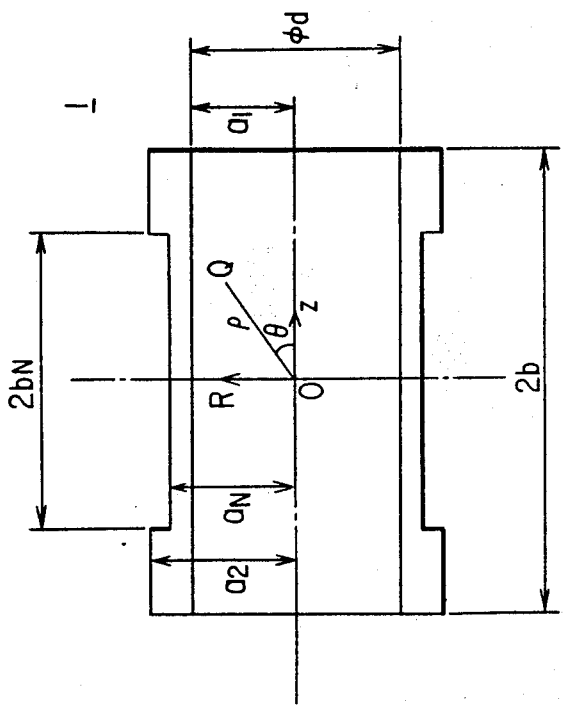
FIG. 1 is a sectional view of a prior-art uniform magnetic field coil.

In FIG. 3, n pairs of cylindrical coil elements 10a to 10f are disposed symmetrically about a plane R oriented perpendicular to the longitudinal axis Z of the uniform magnetic field coil assembly. When the magnetic field relative to the longitudinal axis of the coil assembly is desired, it can be represented by the following equation (7):

$$Hz = \sum_{m=1}^{n} j(m)a_1(m)f(\alpha(m), \beta(m), \beta_c(m)) + \sum_{m=1}^{n} j(m)a_1(m)fE_2(\alpha(m), \beta(m), \beta_c(m))\{\rho/a_1(m)\}^2 P_2(u) + \sum_{m=1}^{n} j(m)a_1(m)fE_4(\alpha(m), \beta(m), \beta_c(m))\{\rho/a(m)\}^4 P_4(u) + \ldots \quad (7)$$

Assume that the shape of the coil is predetermined and that the current density j(m) is variable. The coefficients (those of even degree) of $\rho^2$ to $\rho^{2n-2}$ can be set to zero by generating a current j(m) which satisfies the following equation (8) for the coil assembly and then setting the DC magnetic field to $H_0$. In other words, a 2n degree compensation coil assembly can be realized. Since the coil elements are disposed symmetrically, those (the coefficients of odd degree) of $\rho^1$ to $\rho^{2n-1}$ are zero.

$$\left.\begin{array}{l} \sum_{m=1}^{n} j(m)a_1(m)F(\alpha(m), \beta(m), \beta_c(m)) = H_0 \\ \sum_{m=1}^{n} j(m)a_1(m)E_2(\alpha(m), \beta(m), \beta_c(m))\{1/a_1(m)\}^2 = 0 \\ \vdots \\ \sum_{m=1}^{n} j(m)a_1(m)EF_{2n-2}(\alpha(m), \beta(m), \beta_c(m))\{1/a_1(m)\}^{2n-2} = 0 \end{array}\right\} \quad (8)$$

Therefore, in FIG. 3, in the case where n=3 for instance, the sextic compensation coil assembly is realized, and in the case where n=4, an octal compensation coil assembly is realized.

Figure 4:
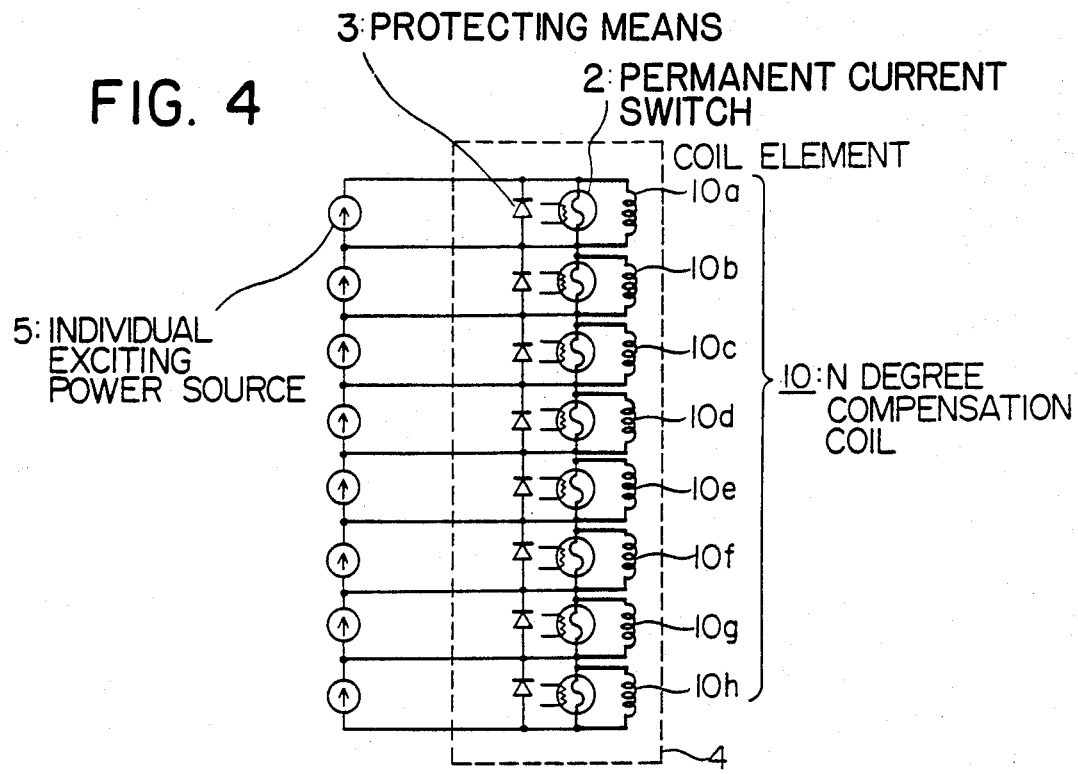
FIGS. 4, 5 and 6 are circuit diagrams of three embodiments of the uniform magnetic field coil assembly according to this invention.

The preferred embodiment of this invention will be described with reference to FIG. 4. FIG. 4 shows a circuit diagram of a uniform magnetic field superconductive coil assembly acting as an octal compensation coil consisting of eight coil elements. In FIG. 4, numerals 10a to 10h denote coil elements which form the coil assembly 10. Numeral 4 denotes a superconductive environment coil housing for the coil assembly in the form of a cryostat which is part of a conduction state control means for controlling the conductive state of the coil elements that provides an environment with a temperature which produces a superconductive conduction state. Numeral 2 denotes permanent current switches provided individually corresponding to the coil elements 10a to 10h. The permanent current switches 2 are switched between a superconductive state (where the resistance is effectively zero) and a normal conductive condition state (where the resistance is of a predetermined non-zero value) by selectively activating a temperature modification means. The temperature modification means comprises heaters provided corresponding to the switches 2 which are energized or deenergized by means of a power source (not shown) to change the temperature of a switch, thus changing its conduction state. Numeral 3 denotes diodes for protecting permanent current switches 2 to be used as the bypass circuits in case that some of the permanent current switches 2 superconductively break down. The diodes 3 may be replaced by predetermined low resistance elements. Numeral 5 denotes individual exciting power sources, each corresponding to one of the elements 10a or 10h. In FIG. 4, thick lines denote a portion where the permanent current flows (a so-called superconductive conductor portion) in which the resistance of the connector of the superconductive conductor portion is greatly reduced (for example, $10^{-10}$ ohms or less). The coil elements 10a to 10h are respectively operated by individual corresponding current values.

Figure 5:
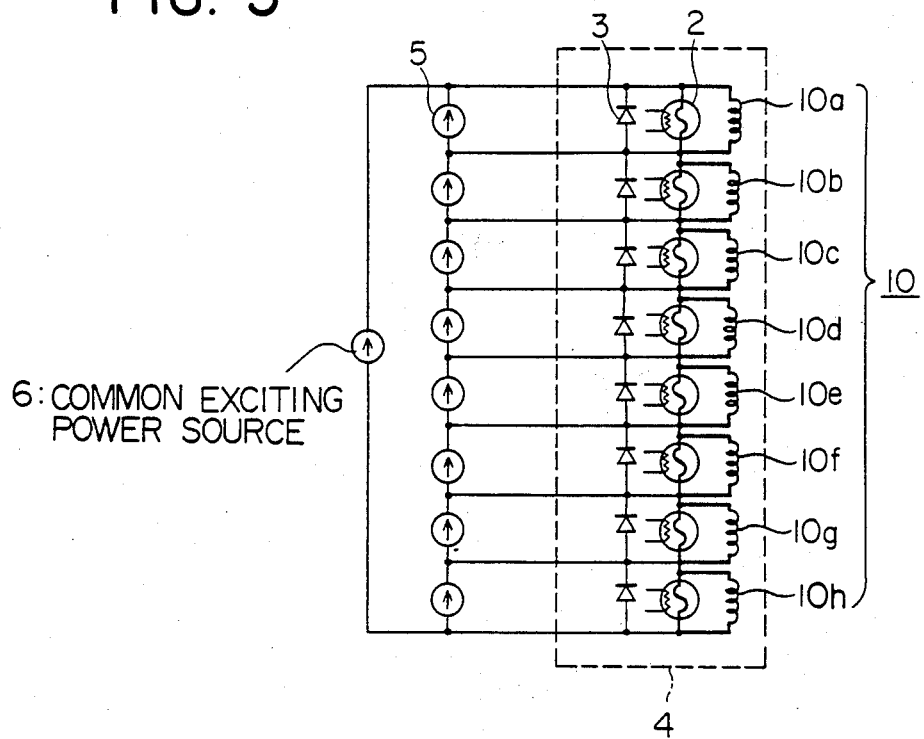

FIG. 5 is a circuit diagram showing another embodiment of a superconductive uniform magnetic field coil assembly according to this invention. In FIG. 5, this embodiment is the same as that in FIG. 4 except that a common exciting power source 6 is provided. An average current is supplied to the respective coil elements 10a to 10h from the common exciting power source 6, while a differential current equal to the difference between an actual required current and the average current is supplied from the individual exciting power sources 5 individually corresponding to the coil elements 10a to 10h. Thus, this embodiment has the advantage that the entire KVA of all the exciting power sources including the common exciting power source can be reduced.

Figure 6:
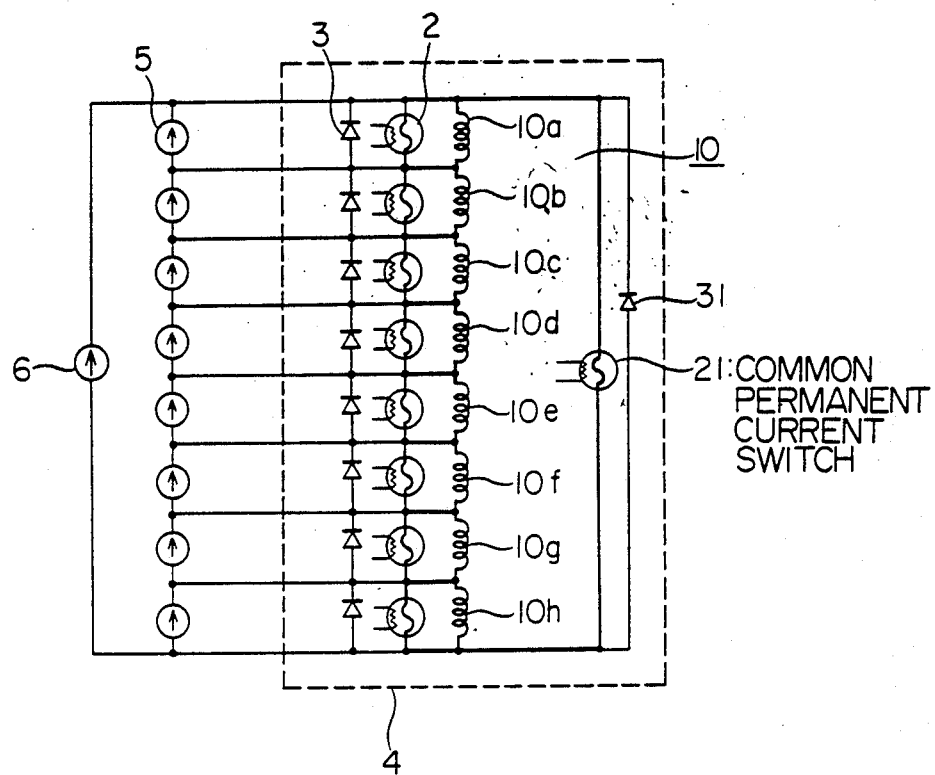

FIG. 6 is a circuit diagram showing still another embodiment of a superconductive uniform magnetic field coil assembly according to this invention. In FIG. 6, this embodiment is essentially the same as that in FIG. 5 except that the coil elements 10a to 10h are connected in series without any intermediary of low resistance connectors, a common permanent current switch 21 commonly used for the coil elements 10a to 10h connected in series is provided, and a diode 31 for protecting the common permanent current switch 21 is provided. By using such a construction, the current flowing to the coil elements 10a to 10h can be individually finely regulated by using the individual exciting power sources 5 in the case where the coil elements 10a to 10h are in a permanent current driven state as they are driven by the average current (i.e., in the superconductive state). When the current of each of the coil elements 10a to 10h is finely regulated, the corresponding permanent current switch 2 is turned OFF (i.e., a resistance is generated). After the fine regulation of the current is completed and the current flowing to each of the coil elements becomes steady, the corresponding permanent current switch 2 is turned ON (i.e., the resistance is set to zero), and the coil assembly 10 consisting of the coil elements 10a to 10h is operated permanently by the current generating the uniform magnetic field.

Figure 7:
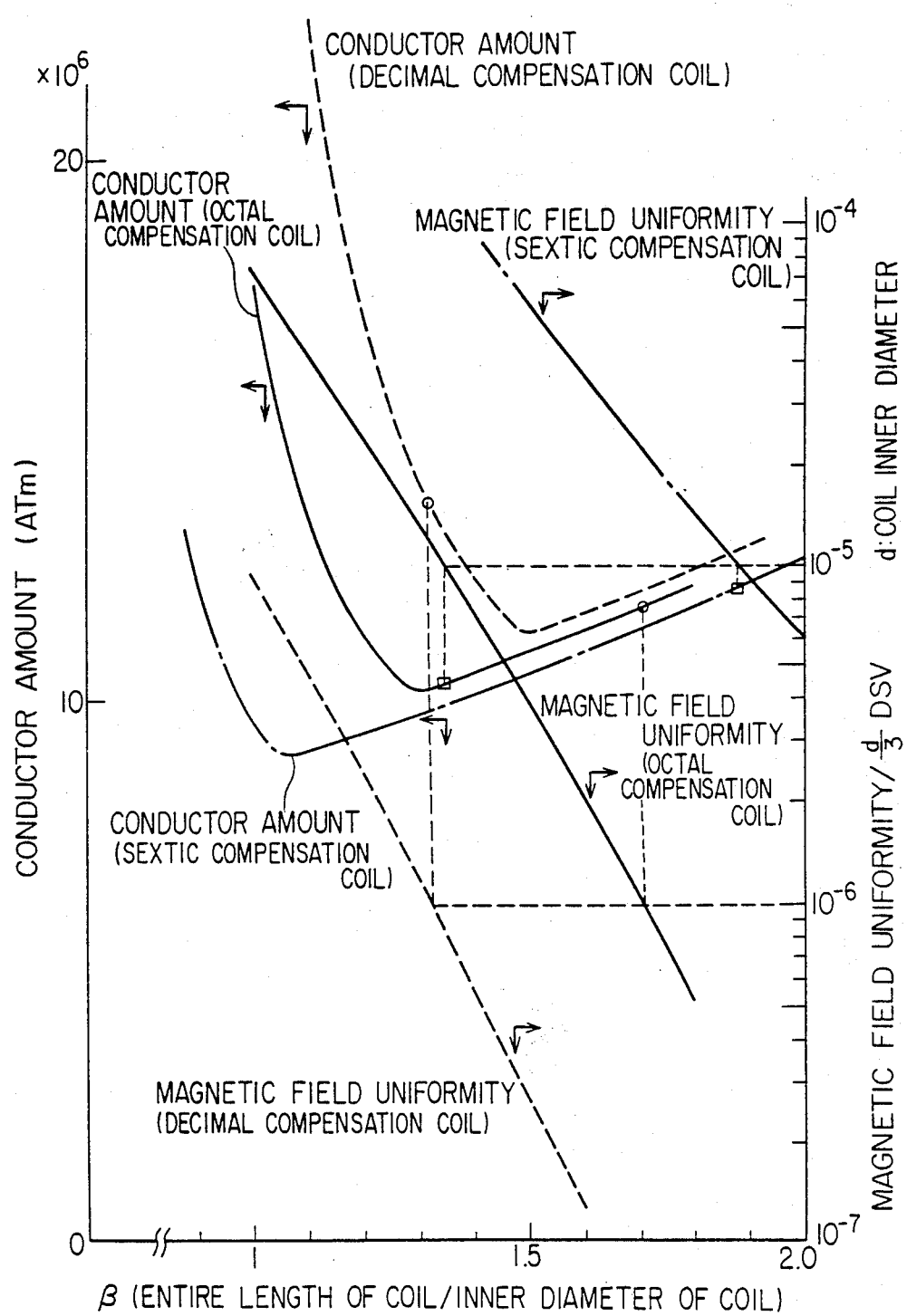
FIG. 7 is a graphic diagram showing the mutual relationship of various characteristics of the uniform magnetic field coil assembly according to this invention.

FIG. 7 shows various characteristic relationships when the uniform magnetic field coil according to this invention is applied to magnetic imaging. More particularly, shown in FIG. 7 for three cases where the number of pairs of coil elements varies, are the mutual relationships between the necessary conductor amount (ATm), the magnetic uniformity representing the uniformity in a spherical space of diameter ($\frac{2}{3}$)$a_1$, and $\beta$ (the entire length of the coil/the inner diameter of the coil). The calculating conditions used to create the graph in FIG. 7 are including the following: an inner diameter of all coil elements is 1.15 m, the central magnetic field of 1.5T, equal lengths of all coil elements in the longitudinal direction, and gaps of zero between the coil elements. The calculating conditions are set by presuming a required magnetic field uniformity of about $10^{-6}$ to $10^{-5}$. The compensating degree of the uniform magnetic field coil assembly is 6 to 10 in which the magnetic field uniformity described above is obtained. The entire length does not largely exceed twice the inner diameter, and the increase in the necessary conductor amount is not so remarkable. Therefore, the number of coil elements required is 6 to 10. If the number of coil elements reduces less than 6, the entire length of the uniform magnetic field coil assembly becomes excessively long, while if the number of the coil elements increases more than 10, the necessary conductor amount becomes excessively bulky. For example, if the desired magnetic field uniformity is chosen as $10^{-6}$, in case of an octal compensation coil assembly, $\beta \simeq 1.7$, and the conductor amount $= 11.7 \times 10^6$ ATm. In case of a decimal compensation coil assembly, $\beta \simeq 1.3$, and the conductor amount $= 13.7 \times 10^6$ ATm, and, thus, it is recognized that the octal or decimal compensation coil is practical. If the desired magnetic field uniformity is chosen as $10^{-5}$, in the case of a sextic compensation coil assembly, $\beta \simeq 1.9$ and the conductor amount $\simeq 12 \times 10^6$ ATm. In the case of an octal compensation coil assembly $\beta \simeq 1.35$ and the conductor amount $\simeq 10.2 \times 10^6$ ATm, and, again, it is recognized that the sextic or octal compensation coil is practical. The above-mentioned $\beta$ and the conductor amount can be further reduced by optimizing the axial length, the gap, the inner diameter and the outer diameter of the respective coil elements for generating the uniform magnetic field. As apparent from the foregoing description, the uniform magnetic field coil assembly according to this invention is practical from sextic to decimal compensation coil assemblies to apply to magnetic imaging.

According to this invention as described above, a uniform magnetic field coil assembly is composed of a suitable number of coil elements which remove irregular magnetic field components by regulating the current flowing to the respective coil elements, thereby resulting in the generation of a preferable uniform magnetic field. Therefore, the tolerable dimensional errors inherent in the manufacturing process of the uniform magnetic field coil assembly are greater, and the irregular magnetic field components based on said errors can be easily removed by regulating the current flowing to the respective coil elements of the magnetic field coil assembly.

What is claimed is:

1. A superconducting uniform magnetic field coil assembly for generating a uniform magnetic field, said assembly having a longitudinal axis and comprising:

pairs of coil elements arranged along a longitudinal axis wherein said coil elements in each pair are symmetrically disposed about a plane perpendicular to the longitudinal axis and said coil elements are electrically connected in series;

a plurality of permanent current switch means, respectively electrically connected in parallel with corresponding ones of said coil elements, for controlling a current flowing through said corresponding ones of said coil elements;

a plurality of protection means, respectively electrically connected in parallel with corresponding ones of said coil elements, for respectively protecting said corresponding ones of said current switch means; and individual exciting power source means, respectively electrically connected in parallel with each corresponding one of said coil elements, for respectively providing current to said corresponding individual ones of said coil elements and for regulating current flowing to said individual coil elements to compensate for irregularities in the magnetic field produced by said assembly.

2. A superconducting uniform magnetic field coil assembly according to claim 1 wherein said plurality of permanent current switch means includes heater means for selectively varying the temperature of individual ones of said plurality of permanent current switch means.

3. A superconducting uniform magnetic field coil assembly according to claim 2 further comprising a cryostat housing said pairs of coil elements, said plurality of permanent current switch means, and said plurality of protection means.

4. A superconducting uniform magnetic field coil assembly according to claim 1 having a common exciting power source connected in parallel with said assembly.

5. A superconducting uniform magnetic field coil assembly according to claim 4 having a common permanent current switch connected in parallel with said assembly.

6. A superconducting uniform magnetic field coil assembly according to claim 1 wherein there are three to five pairs of said coil elements.

7. A superconducting uniform magnetic field coil assembly according to claim 1 wherein each of said coil elements in a said pair is substantially the same size, but not all of said coil elements in said assembly are the same size.

* * * * *